(12) United States Patent
Choi et al.

(10) Patent No.: US 9,793,515 B2
(45) Date of Patent: Oct. 17, 2017

(54) ORGANIC LIGHT-EMITTING DISPLAY APPARATUS INCLUDING REFLECTION ADJUSTING LAYER

(71) Applicant: Samsung Display Co., Ltd., Yongin-Si, Gyeonggi-Do (KR)

(72) Inventors: Chungsock Choi, Yongin-si (KR); Sooyoun Kim, Yongin-si (KR); Hyunho Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/157,640

(22) Filed: May 18, 2016

(65) Prior Publication Data

US 2017/0149018 A1 May 25, 2017

(30) Foreign Application Priority Data

Nov. 23, 2015 (KR) ........................ 10-2015-0163977

(51) Int. Cl.
*H01L 51/52* (2006.01)
*H01L 27/32* (2006.01)

(52) U.S. Cl.
CPC ...... *H01L 51/5271* (2013.01); *H01L 27/3246* (2013.01); *H01L 51/5253* (2013.01); *H01L 51/5284* (2013.01)

(58) Field of Classification Search
CPC ............. H01L 27/3246; H01L 51/5253; H01L 51/5271; H01L 51/5284
See application file for complete search history.

(56) References Cited

U.S. PATENT DOCUMENTS

| 8,004,181 B2* | 8/2011 | Lee ..................... H01L 51/5265 313/504 |
| 2003/0146693 A1 | 8/2003 | Ishihara et al. |
| 2005/0179368 A1 | 8/2005 | Ryu et al. |
| 2010/0127614 A1* | 5/2010 | Lee ..................... H01L 51/5265 313/504 |
| 2010/0148192 A1 | 6/2010 | Jung et al. |
| 2010/0253607 A1* | 10/2010 | Shiozaki ............. H01L 27/3244 345/76 |

(Continued)

FOREIGN PATENT DOCUMENTS

| KR | 1020050076464 A | 7/2005 |
| KR | 1020110049476 A | 5/2011 |
| KR | 1020120092907 A | 8/2012 |

(Continued)

*Primary Examiner* — Allan R Wilson
(74) *Attorney, Agent, or Firm* — Cantor Colburn LLP (57) ABSTRACT

An organic light-emitting display apparatus includes: pixel electrodes spaced apart from one another; a pixel defining layer overlapping edges of each of the pixel electrodes; an opposite electrode commonly overlapping the pixel electrodes and the pixel defining layer; an emission layer provided in plural between the pixel electrodes and the opposite electrode, the plural emission layers respectively overlapping the pixel electrodes; a reflection adjustment layer overlapping the pixel electrodes and the pixel defining layer, the reflection adjustment layer having conductivity and contacting the opposite electrode; and a phase control layer provided in plural spaced apart from each other between the opposite electrode and the reflection adjustment layer.

12 Claims, 7 Drawing Sheets

(56) References Cited

U.S. PATENT DOCUMENTS

2012/0280612 A1    11/2012  Lee et al.
2016/0079567 A1*    3/2016  Cho .................... H01L 51/5284
                                                          257/40

FOREIGN PATENT DOCUMENTS

| KR | 1020130037445 A | 4/2013 |
| KR | 1020150084239 A | 7/2015 |
| KR | 1020160031108 A | 3/2016 |

\* cited by examiner

ORGANIC LIGHT-EMITTING DISPLAY APPARATUS INCLUDING REFLECTION ADJUSTING LAYER

This application claims priority to Korean Patent Application No. 10-2015-0163977, filed on Nov. 23, 2015, and all the benefits accruing therefrom under 35 U.S.C. §119, the content of which in its entirety is herein incorporated by reference.

BACKGROUND

1. Field

One or more embodiments relate to an organic light-emitting display apparatus, and more particularly, to an organic light-emitting display apparatus capable of displaying high quality images.

2. Description of the Related Art

An organic light-emitting display apparatus is a display apparatus, in which each pixel among a plurality of pixels includes an organic light-emitting diode. An organic light-emitting diode includes a pixel electrode, an opposite electrode facing the pixel electrode, an intermediate layer disposed between the pixel electrode and the opposite electrode, and an emission layer. In such an organic light-emitting display apparatus, a pixel electrode is an island type member patterned in each of the pixels, whereas an opposite electrode is a single body member common with respect to the plurality of pixels.

SUMMARY

One or more embodiments include an organic light-emitting display apparatus capable of displaying high quality images.

According to one or more embodiments, an organic light-emitting display apparatus includes: a plurality of pixel electrodes spaced apart from one another; a pixel defining layer overlapping edges of each of the plurality of pixel electrodes; an opposite electrode disposed commonly overlapping the plurality of pixel electrodes and the pixel defining layer; an emission layer provided in plural between the plurality of pixel electrodes and the opposite electrode, the plural emission layers respectively overlapping the plurality of pixel electrodes; a reflection adjustment layer disposed overlapping the plurality of pixel electrodes and the pixel defining layer, the reflection adjustment layer having conductivity and contacting the opposite electrode; and a phase control layer provided in plural spaced apart from each other between the opposite electrode and the reflection adjustment layer.

The reflection adjustment layer may define a light extinction coefficient greater than a light extinction coefficient defined by the phase control layer.

The phase control layer may be disposed directly between the opposite electrode and the reflection adjustment layer, at each of the plural emission layers, a maximum thickness of the phase control layer may define a first thickness and a maximum thickness of the reflection adjustment layer may define a second thickness, among light incident to the reflection adjustment layer at each of the plural emission layers, a first light may be reflected by an upper surface of the reflection adjustment layer and a second light may be transmitted through the reflection adjustment layer and the phase control layer to be reflected by an upper surface of the opposite electrode, and a sum of the first thickness and the second thickness may cause destructive interference of the first and second lights.

The phase control layer may be disposed directly between the opposite electrode and the reflection adjustment layer, at each of the plural emission layers, an upper surface of the opposite electrode and an upper surface of the reflection adjustment layer may be spaced apart from each other by a distance, among light incident to the reflection adjustment layer at each of the plural emission layers, a first light may be reflected by an upper surface of the reflection adjustment layer and a second light may be transmitted through the reflection adjustment layer and the phase control layer to be reflected by an upper surface of the opposite electrode, and a maximum of the distance between the upper surface of the opposite electrode and the upper surface of the reflection adjustment layer at each of the plural emission layers may cause destructive interference of the first and second lights.

The reflection adjustment layer may include Ti, Mo, Mn, Cr, W, Ti, Ni, Co, Cu, $CrN_x$, $TiN_x$, $TiAlN_x$, NiS, or TiC.

The phase control layer may include $SiN_x$, $SiO_2$, SiCN, LiF, $MgF_2$, $CaF_2$, SiON, $Ta_xO_y$, or $TiO_x$.

The phase control layer may include parts spaced apart from each other to expose portions of the opposite electrode and the reflection adjustment layer having conductivity may contact the exposed portions of the opposite electrode between the parts of the phase control layer spaced apart from each other.

The phase control layer may include parts spaced apart from each other and corresponding respectively to the plurality of pixel electrodes.

The organic light-emitting display apparatus may further include a display area in which the plurality of pixel electrodes is disposed. The reflection adjustment layer may be provided as a single body to commonly overlap the plurality of pixel electrodes in the display area.

The reflection adjustment layer which commonly overlaps the plurality of pixel electrodes in the display area may correspond to the opposite electrode which commonly overlaps the plurality of pixel electrodes and the pixel defining layer.

The plurality of pixel electrodes spaced apart from one another may define spaces therebetween. The organic light-emitting display apparatus may further include: a thin film encapsulation layer commonly overlapping the plurality of pixel electrodes and the pixel defining layer to cover the reflection adjustment layer; and a light absorbing layer over the thin film encapsulation layer, the light absorbing layer defining portions thereof spaced apart from each other to correspond to the plurality of pixel electrodes.

The plurality of pixel electrodes spaced apart from one another may define spaces therebetween. The organic light-emitting display apparatus may further include: an encapsulation substrate commonly overlapping the plurality of pixel electrodes and the pixel defining layer to cover the reflection adjustment layer; and a light absorbing layer on the encapsulation substrate, the light absorbing layer defining portions thereof spaced apart from each other to correspond to the plurality of pixel electrodes. The light absorbing layer may be disposed between the encapsulation substrate and the reflection adjustment layer.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Although the invention allows for various changes and numerous embodiments, particular embodiments will be illustrated in the drawings and described in detail in the written description. However, thesis embodiments are not intended to limit the invention to particular modes of practice, and it is to be appreciated that all changes, equivalents, and substitutes that do not depart from the spirit and technical scope are encompassed in the invention. In the description, certain detailed explanations of the related art are omitted when it is deemed that they may unnecessarily obscure the essence of the invention.

Hereinafter, the invention will be described in detail by explaining embodiments of the invention with reference to the attached drawings. Like reference numerals in the drawings denote like elements.

In the following examples, when a first element such as a layer, a film, an area, or a plate is over a second element, such a configuration includes the case where the first element is directly on the second element and the case where a third element is interposed between the first element and the second element. In contrast, when a layer, a film, an area, or a plate is referred to as being "directly on" another layer, film, area or plate, there are no intervening elements present. Sizes of components in the drawings may be exaggerated for convenience of explanation. In other words, since sizes and thicknesses of components in the drawings are arbitrarily illustrated for convenience of explanation, the following embodiments are not limited thereto.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In a conventional organic light-emitting display apparatus, a current-resistance (IR) drop, which is a voltage drop, occurs in an opposite electrode that is commonly disposed with respect to a plurality of pixels, and an unintended brightness deviation among the plurality of pixels may occur. Therefore, an organic light-emitting display apparatus is desired in which the IR drop (i.e., voltage drop) in an opposite electrode is effectively prevented or reduced.

Figure 1:
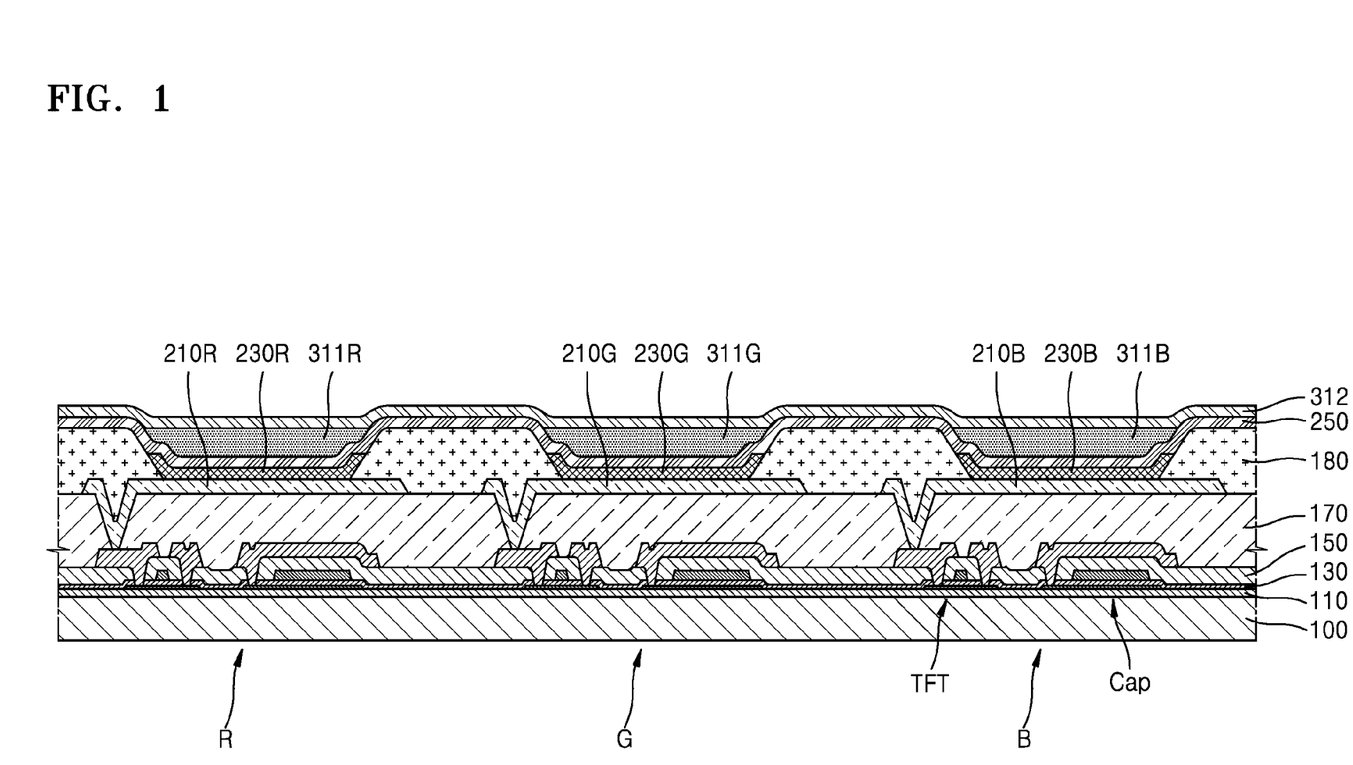
FIG. 1 is a schematic cross-sectional view of an exemplary embodiment of an organic light-emitting display apparatus according to the invention.
Figure 2:
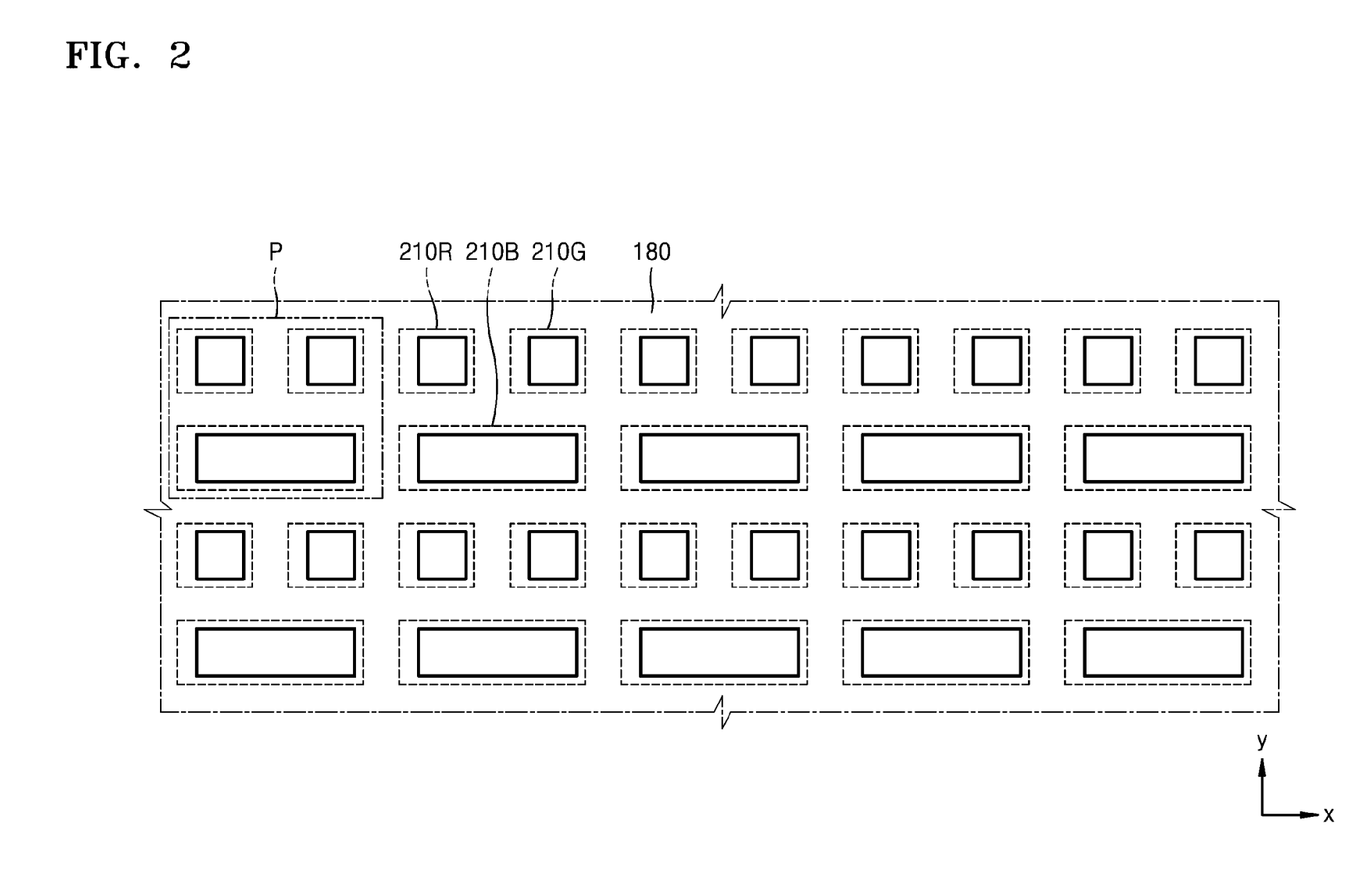
FIG. 2 is a schematic top plan view of the organic light-emitting display apparatus of FIG. 1.

FIG. 1 is a schematic cross-sectional view of an exemplary embodiment of an organic light-emitting display apparatus according to the invention, and FIG. 2 is a schematic top plan view of the organic light-emitting display apparatus of FIG. 1.

The exemplary embodiment of the organic light-emitting display apparatus according to the invention includes organic light-emitting diodes ("OLEDs") R, G and B, phase control layers 311R, 311G and 311B, and a reflection adjustment layer 312. The reflection adjustment layer 312 is disposed closest to the viewing side of the organic light-emitting display apparatus. Each of the OLEDs R, G and B may be disposed over a (base) substrate 100 as shown in FIG. 1, and may include a thin film transistor TFT and/or a capacitor Cap, if necessary. Each of the OLEDs R, G and B includes a pixel electrode as shown in FIG. 1. FIG. 1 shows a plurality of pixel electrodes 210R, 210G and 210B. The pixel electrode 210R, the pixel electrode 210G and the pixel electrode 210B may be included in one pixel P, as shown in FIG. 2. The positions labeled R, G and B at which OLEDs are disposed in FIG. 1 may also be referred to as sub-pixels R, G and B, respectively.

The substrate 100 may include various materials such as a glass material, a metal material and a plastic material, e.g., polyethylene terephthalate ("PET"), polyethylene naphthalate ("PEN"), and polyimide. The substrate 100 may include a display area, over which a plurality of pixels are arranged and at which an image is displayed, and a peripheral area surrounding the display area and at which the image is not displayed.

The plurality of pixel electrodes 210R, 210G and 210B may be arranged over or on the substrate 100. The pixel electrodes 210R, 210G and 210B may be reflective electrodes. In an exemplary embodiment, each pixel electrode may include a reflective layer including Ag, Mg, Al, Pt, Pd, Au, Ni, Nd, Ir, Cr, or a compound or combination thereof, and a layer including indium tin oxide ("ITO"), indium zinc oxide ("IZO"), ZnO or $In_2O_3$. Structures and materials of the pixel electrodes 210R, 210G and 210B are not limited thereto, that is, the pixel electrodes may be modified variously. The pixel electrodes 210R, 210G and 210B may be located within the display area of the substrate 100.

A pixel defining layer 180 includes or defines openings corresponding to sub-pixels of the pixel P. The openings expose respective center portions of the pixel electrodes 210R, 210G and 210B. In addition, a distance between adjacent sidewalls of the pixel defining layer 180 disposed near end or edge portions of the pixel electrodes 210R, 210G and 210B increases in a direction from the pixel electrodes 210R, 210G and 210B to an opposite electrode 250 which is disposed above the pixel electrodes 210R, 210G and 210B in the thickness direction, in order to prevent occurrence of arc at the end portions of the pixel electrodes 210R, 210G and 210B.

FIG. 2 is a top plan view showing the pixel defining layer 180 covering edges of the pixel electrodes 210R, 210G and 210B. Edges of the pixel defining layer 180 are indicated by a dark solid line entirely disposed within edges (dotted lines) of the pixel electrodes 210R, 210G and 210B. Centers of the openings (dark solid line) in the pixel defining layer 180 may be different from center portions of the pixel electrodes 210R, 210G, and 210B (dotted line) so that portions of the pixel electrodes 210R, 210G and 210B, which are connected or contacted to the thin film transistor TFT, may be covered by the pixel defining layer 180.

The thin film transistor TFT and/or the capacitor Cap may be located between the substrate 100 and the pixel electrodes 210R, 210G and 210B. In addition, a buffer layer 110 for reducing or effectively preventing impurities from infiltrating into a semiconductor layer of the thin film transistor TFT, a gate insulating layer 130 for insulating the semiconductor layer from a gate electrode of the thin film transistor TFT, an interlayer insulating layer 150 for insulating the gate electrode of the thin film transistor TFT from source and drain electrodes thereof, a planarization layer 170 covering the thin film transistor TFT and having a flat upper surface, and the other elements may be arranged over the substrate 100. The substrate 100 including those elements up to the reflection adjustment layer 312 may collectively define a display substrate of the organic light-emitting display apparatus.

The OLEDs R, G and B respectively include a plurality of emission layers 230R, 230G and 230B and the opposite electrode 250, in addition to the plurality of pixel electrodes 210R, 210G and 210B. The plurality of emission layers 230R, 230G and 230B are respectively located over the plurality of pixel electrodes 210R, 210G and 210B. That is, the emission layer 230R is located over the pixel electrode 210R, the emission layer 230G is located over the pixel electrode 210G, and the emission layer 230B is located over the pixel electrode 210B. The emission layer 230R may emit red light, the emission layer 230G may emit green light and the emission layer 230B may emit blue light. The invention is not limited to the above-described embodiments. That is, various modifications may be allowed, for example, the plurality of emission layers 230R, 230G and 230B may collectively emit white light so that a color filter (not shown) is further disposed to adjust a wavelength of light that is finally emitted from each pixel.

Referring to FIG. 1 and FIG. 2, the OLEDs R, G and B, the pixel electrodes 210R, 210G and 210B, the phase control layers 311R, 311G and 311B, the openings in the pixel defining layer 180, the emission layers 230R, 230G and 230B and other layers described with reference thereto may be provided in plural arranged in the top plan view. The pixels P may be arranged in a first (x) direction and a second (y) direction which crosses the first direction. The first and second directions may be perpendicular to each other.

Although not shown in the drawings, a first common layer such as a hole injection layer, a hole transport layer, etc. may be disposed between the plurality of pixel electrodes 210R, 210G and 210B and the plurality of emission layers 230R, 230G and 230B, respectively. The first common layer may be a single, unitary layer disposed extended (integrally formed) with respect to the plurality of pixel electrodes 210R, 210G and 210B. In addition, a second common layer such as an electron transport layer, an electron injection layer, etc. may be located over the plurality of emission layers 230R, 230G and 230B, and the second common layer may be a single, unitary layer (integrally formed) with respect to the plurality of pixel electrodes 210R, 210G and 210B.

The opposite electrode 250 is commonly located over the emission layers 230R, 230G and 230B, and the pixel defining layer 180, and may correspond to the plurality of pixel electrodes 210R, 210G and 210B. The opposite electrode 250 may be a single body throughout the entire display area of the organic light-emitting display apparatus. The opposite electrode 250 is a conductive material layer that may transmit at least some of light. The conductive material layer may include a layer including Li, Ca, LiF/Ca, LiF/Al, Al, Mg, or a compound or combination thereof. However, composition or a structure of the opposite electrode 250 is not limited thereto.

The plurality of phase control layers 311R, 311G and 311B are located over the opposite electrode 250 to be spaced apart from each other. Where pixel electrodes 210R and 210G are spaced apart in the first direction, and pixel electrodes 210R and 210G are each spaced apart from the pixel electrode 210B in the second direction by FIG. 2, the plurality of phase control layers 311R, 311G and 311B illustrated in FIG. 1 shows separation thereof in both the first and second directions. The plurality of phase control layers 311R, 311G and 311B may each include $SiN_x$, $SiO_2$, SiCN, LiF, $MgF_2$, $CaF_2$, SiON, $Ta_xO_y$, or $TiO_x$, and may at least partially transmit incident light thereto. The plurality of phase control layers 311R, 311G and 311B may reduce external light reflection in cooperation with the reflection adjustment layer 312 that will be described later.

The reflection adjustment layer 312 is commonly located over the plurality of phase control layers 311R, 311G and 311B, while contacting the opposite electrode 250 located under the plurality of phase control layers 311R, 311G and 311B. Since the plurality of phase control layers 311R, 311G and 311B are spaced apart from each other, portions of the opposite electrode 250 are exposed by the plurality of phase control layers 311R, 311G and 311B. The reflection adjustment layer 312 contacts the portions of the opposite electrode 250 exposed among the plurality of phase control layers 311R, 311G and 311B. The reflection adjustment layer 312 has conductivity and including a conductive material. In more detail, the reflection adjustment layer 312 may include Ti, Mo, Mn, Cr, W, Ti, Ni, Co, Cu, $CrN_x$, $TiN_x$, $TiAlN_x$, NiS, or TiC. The reflection adjustment layer 312 has a thickness of about, for example, about 0.01 micrometer (μm) or less so as to transmit some of incident light. The thickness may be taken in a direction perpendicular to the substrate 100, that is, perpendicular to both the first and second directions. Considering a profile of the reflection adjustment layer 312, the thickness may also be taken in direction normal to a surface of the reflection adjustment layer 312 at a particular point along the profile thereof. In particular, when compared with the phase control layers 311R, 311G and 311B, the reflection adjustment layer 312 has or defines a light extinction coefficient that is greater than that of or defined by the phase control layers 311R, 311G and 311B.

In the aforementioned exemplary embodiment of the organic light-emitting display apparatus according to the invention, since the reflection adjustment layer 312 having the conductivity contacts the opposite electrode 250 at exposed portions thereof, an IR dropping that may occur in the opposite electrode 250 when the reflection adjustment layer 312 does not exist may be effectively prevented or reduced. As such, unintended brightness deviation among the plurality of pixels may be reduced or effectively prevented. Or, even if the brightness deviation occurs, the brightness deviation may be noticeably reduced.

As described above, in order for the reflection adjustment layer 312 to contact the opposite electrode 250, the plurality of phase control layers 311R, 311G and 311B are spaced apart from each other. In FIG. 1, the plurality of phase control layers 311R, 311G and 311B are patterned to be discrete members which correspond respectively to the plurality of pixel electrodes 210R, 210G and 210B which may also be discrete members, but the invention is not limited thereto. In one exemplary embodiment, for example, in a red sub-pixel R and a green sub-pixel G, the phase control layers 311R and 311G may not be spaced apart from each other, but may be a single, unitary member (integrally formed). Where the phase control layers 311R and 311G are a single, unitary member (e.g., no space therebetween), the reflection adjustment layer 312 may contact the opposite electrode 250 between the green sub-pixel G and a blue sub-pixel G spaced apart therefrom, or between the red sub-pixel R and the blue sub-pixel B spaced apart therefrom, and not between the red sub-pixel R and the green sub-pixel G forming the single, unitary member. However, where phase control layers are not spaced apart from each other, a contact area between the reflection adjustment layer 312 and the opposite electrode 250 may increase in order to effectively prevent or reduce the IR drop in the opposite electrode 250 due to the reflection adjustment layer 312. Therefore, in one or more exemplary embodiment of the invention, the plurality of phase control layers 311R, 311G and 311B may be patterned to be spaced apart from each other and to correspond respectively to the plurality of pixel electrodes 210R, 210G and 210B.

Figure 3:
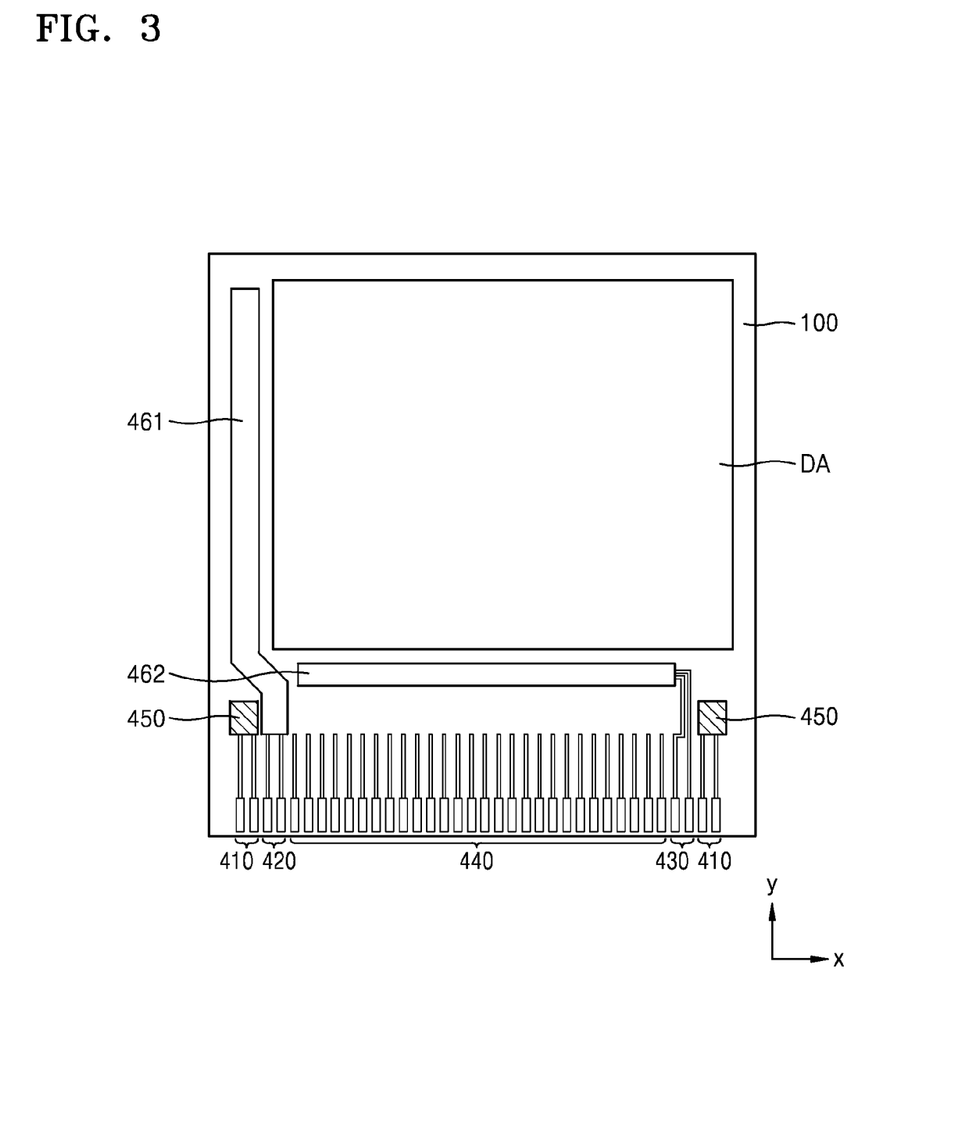
FIG. 3 is another schematic plan view of the organic light-emitting display apparatus of FIG. 1.

FIG. 3 is another schematic top plan view of the organic light-emitting display apparatus of FIG. 1. As shown in FIG. 3, in the organic light-emitting display apparatus, a display area DA in which a plurality of pixel electrodes are located is disposed over or on the substrate 100. In addition, a first driving circuit unit 461 and a second driving circuit unit 462 which transfer electric signals to the display area DA, and electrode power supply lines 450 are disposed in an area (e.g., peripheral or non-display area) extended around the display area DA. Pads 410, 420, 430 and 440 are located at an edge of the substrate 100. The pad 420 transfers an electric signal applied from outside the organic light-emitting display apparatus to the first driving circuit unit 461, the pad 430 transfers an electric signal applied from outside the organic light-emitting display apparatus to the second driving circuit unit 462, and the pad 410 transfers an electric signal applied from outside the organic light-emitting display apparatus to the electrode power supply lines 450. The pad 440 for transferring electric signals to other elements of the organic light-emitting display apparatus that are not shown in FIG. 3 may be located over the substrate 100 as well. The structure of FIG. 1 and FIG. 2 may be disposed entirely in the display area DA of FIG. 3.

In an exemplary embodiment of the organic light-emitting display apparatus according to the invention, the opposite electrode 250 (see FIG. 1) covers the display area DA and further extends therefrom to an outer portion of the display area DA such as to the peripheral area around the display area DA so as to contact the electrode power supply lines 450. That is, in a top plan view, edges of the opposite electrode 250 may be defined at least by a boundary of the display area DA shown in FIG. 3, but may also be defined extended to a boundary of the power supply lines 450 since the opposite electrode 250 extends to contact the electrode power supply lines 450. To reach the electrode power supply lines 450, the opposite electrode 250 in the display area DA continuously extends therefrom to overlap the electrode power supply lines 450.

Similarly, the reflection adjustment layer 312 may cover the display area DA and further extends therefrom to an outer portion of the display area DA such as to the peripheral area around the display area DA, so as to correspond to a planar area of the opposite electrode 250. Here, even if a contact area between the opposite electrode 250 and the electrode power supply lines 450 is not large, the reflection adjustment layer 312 having the conductivity contacts the opposite electrode 250, and thus, occurrence of the IR drop in the opposite electrode 250 may be effectively prevented or reduced noticeably.

In particular, in one or more exemplary embodiment of the organic light-emitting display apparatus according to the invention, since the contact area between the reflection adjustment layer 312 and the opposite electrode 250 in the display area DA is relatively large, the effect of effectively preventing or reducing the IR drop in the opposite electrode 250 may be improved. In the exemplary embodiment, a contact area between the reflection adjustment layer 312 and the opposite electrode 250 in the display area DA is enlarged, because the reflection adjustment layer 312 and the opposite electrode 250 contact each other between every adjacent pair of pixel electrodes 210R, 210G and 210B within substantially an entire of the display area DA, as shown in FIG. 1. The reflection adjustment layer 312 may be a single body throughout the entire display area DA in which the plurality of pixel electrodes 210R, 210G and 210B are located. Also, as described above, the reflection adjustment layer 312 may extend from covering the display area DA to be disposed at the outer portion of the display area DA, so as to correspond to the opposite electrode 250.

Figure 4:
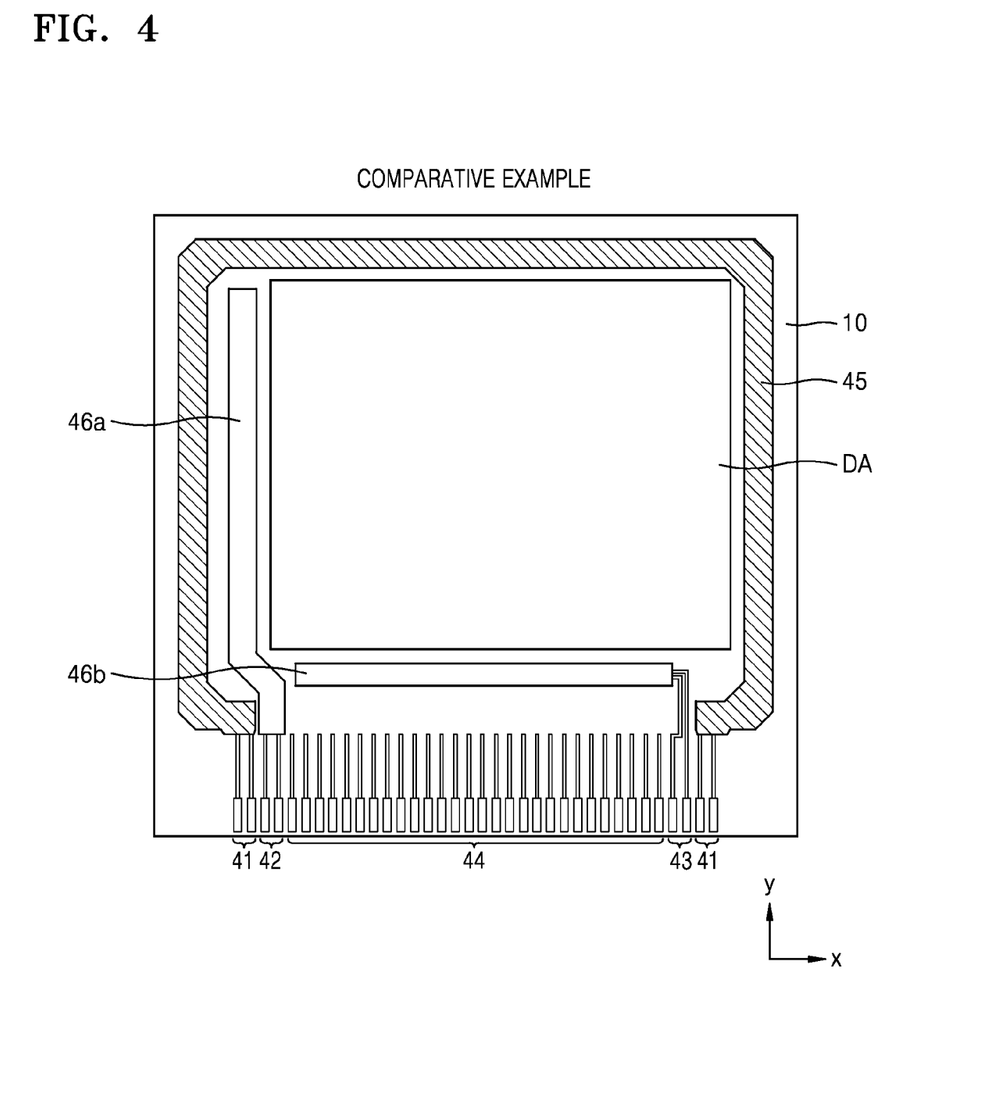
FIG. 4 is a schematic plan view of an organic light-emitting display apparatus according to a comparative example.

FIG. 4 is a schematic plan view of an organic light-emitting display apparatus according to a comparative example. As shown in FIG. 4, in the organic light-emitting display apparatus according to the comparative example, a display area DA in which a plurality of pixel electrodes are located is disposed over a substrate 10. In addition, a first driving circuit unit 46a and a second driving circuit unit 46b are located around the display area DA in a non-display area which surrounds the display area DA, and an electrode power supply line 45 is located in the non-display area outside the first and second driving circuit units 46a and 46b. Pads 41, 42, 43 and 44 are located at an edge of the substrate 10. The pad 42 transfers an electric signal applied from outside the comparative organic light-emitting display apparatus to the first driving circuit unit 46a, the pad 43 transfers an electric signal applied from outside the comparative organic light-emitting display apparatus to the second driving circuit unit 46b, and the pad 41 transfers an electric signal applied from outside the comparative organic light-emitting display apparatus to the electrode power supply line 45. The pad 44 for transferring electric signals to the other elements of the comparative organic light-emitting display apparatus that are not shown in FIG. 3 may be located over the substrate 10.

In the organic light-emitting display apparatus according to the comparative example, the opposite electrode covers the display area DA and further extends therefrom to an outer portion of the display area DA so as to contact the electrode power supply line 45. Here, as shown in FIG. 4, since the electrode power supply line 45 surrounds the display area DA and occupies a larger area than that of the power supply lines 450 in the exemplary embodiment according to the invention, a contact area between the opposite electrode and the electrode power supply line 45 may be increased in the comparative example. Also, if the opposite electrode is considered as contacting the electrode power supply line 45 throughout the most area surrounding the display area DA, the IR drop in the opposite electrode within the display area DA may be undesirably reduced.

However, in the organic light-emitting display apparatus according to the comparative example, an overall area of the electrode power supply line 45 increases, and accordingly, an area of a non-display space, excluding the display area DA, increases in the organic light-emitting display apparatus. That is, since the electrode power supply line 45 is arranged to surround the display area DA, the overall area surrounding the display area DA increases as much as the area over which the electrode power supply line 45 is disposed. However, in one or more exemplary embodiment of the organic light-emitting display apparatus according to the invention, the area of the electrode power supply line 450 may be greatly reduced while preventing or reducing the occurrence of the IR drop in the opposite electrode 250 as shown in FIG. 3, and thus, the area of the dead space may be greatly reduced.

Figure 5:
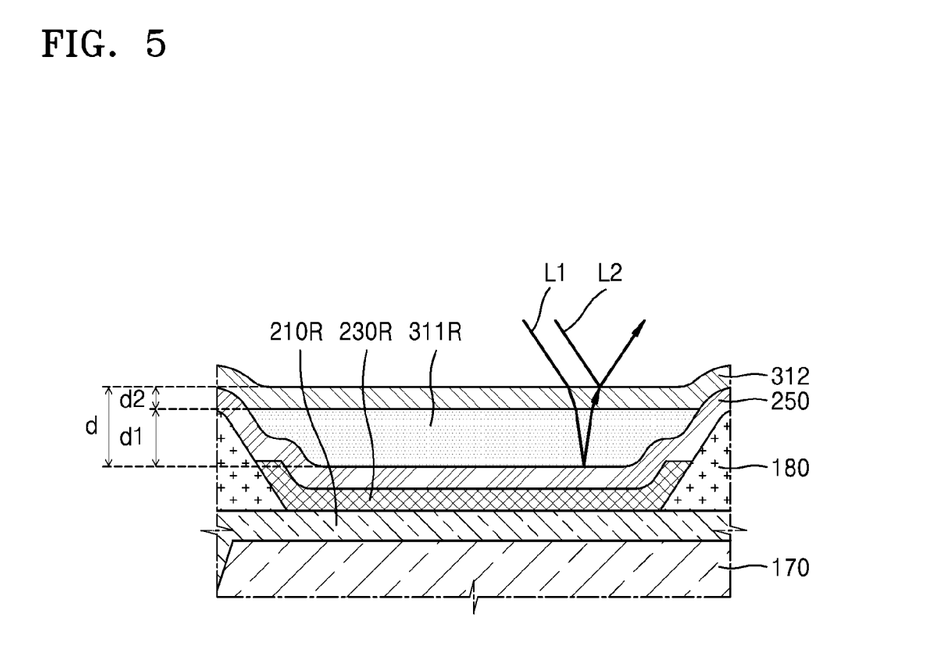
FIG. 5 is an enlarged schematic cross-sectional view of a portion of the organic light-emitting display apparatus of FIG. 1.

In addition, one or more exemplary embodiment of the organic light-emitting display apparatus including the reflection adjustment layer 312 according to the invention may greatly increase visibility of displayed images while effectively preventing or reducing the IR drop in the opposite electrode 250 and reducing reflection of external light. This will be described with reference to FIG. 5. FIG. 5 is a schematic cross-sectional view of an enlarged portion of the organic light-emitting display apparatus of FIG. 1.

As shown in FIG. 5, some of light proceeding to the organic light-emitting display apparatus from outside thereof transmits through the reflection adjustment layer 312 to enter the organic light-emitting display apparatus (refer to L1), and other of the light proceeding to the organic light-emitting display apparatus from outside thereof is reflected by an upper surface of the reflection adjustment layer 312 (refer to L2). As described above, the reflection adjustment layer 312 has conductivity, and thus, may transmit some of the incident light (refer to L1) as described above. The light L1 incident into the reflection adjustment layer 312 enters the phase control layer 311R, and then, is reflected by the upper surface of the opposite electrode 250 to be finally discharged to the outside of the reflection adjustment layer 312.

Here, there is a difference between optical paths of the light L1 reflected by the upper surface of the opposite electrode 250 and of the light L2 reflected by the upper surface of the reflection adjustment layer 312, and accordingly, the light L1 and the light L2 interfere with each other. The above difference between the optical paths may be determined according to a geometrical structure and Snell's law, and may be expressed by a function of distance between the upper surface of the opposite electrode 250 and the upper surface of the reflection adjustment layer 312. Therefore, by adjusting the distance between the upper surface of the opposite electrode 250 and the upper surface of the reflection adjustment layer 312, a destructive interference may occur between the light L1 reflected by the upper surface of the opposite electrode 250 and the light L2 reflected by the upper surface of the reflection adjustment layer 312, thereby greatly reducing an external light reflectivity. This may result in improving the image visibility.

As shown in FIG. 1, when the phase control layers 311R, 311G and 311B and the reflection adjustment layer 312 are located over the opposite electrode 250 and any other layers are not disposed between the opposite electrode 250 and the reflection adjustment layer 312 (e.g., only the phase control layers 311R, 311G and 311B are between the opposite electrode 250 and the reflection adjustment layer 312), the distance (d in FIG. 5) between the upper surface of the opposite electrode 250 and the upper surface of the reflection adjustment layer 312 may be regarded as a sum of a thickness (d1 in FIG. 5) of the phase control layer 311R, 311G or 311B and a thickness of the reflection adjustment layer 312 (d2 in FIG. 5). For an area where the reflection adjustment layer 312 overlaps the phase control layer 311R, 311G or 311B, the thicknesses may be maximum distances of the above-described features. Also, the distance (d in FIG. 5) between the upper surface of the opposite electrode 250 and the upper surface of the reflection adjustment layer 312 may be adjusted by adjusting the thickness (d1 in FIG. 5) of the phase control layers 311R, 311G and 311B which have a relatively lower light extinction coefficient and a higher reflectivity than those of the reflection adjustment layer 312.

As described above, one or more exemplary embodiment of the organic light-emitting display apparatus according to the invention may have various effects, for example, reducing the IR drop in the opposite electrode 250 by using the reflection adjustment layer 312, and moreover, significantly reducing the external light reflectivity by using the phase control layers 311R, 311G and 311B and the reflection adjustment layer 312 at thicknesses defined relative to each other.

As an alternative exemplary embodiment of an organic light-emitting display apparatus according to the invention, the phase control layers 311R, 311G and 311B may be omitted while the reflection adjustment layer 312 is provided such as in a direct relationship with the opposite electrode 250. Here, in consideration of the light interference described above, the thickness of the reflection adjustment layer 312 may only be adjusted since the phase control layers 311R, 311G and 311B are omitted. However, the reflection adjustment layer 312 should have sufficient conductivity in order to effectively prevent or reduce the IR drop in the opposite electrode 250. To do this, if the reflection adjustment layer 312 includes the aforementioned materials, transmittance through the reflection adjustment layer 312 is rapidly reduced as the thickness of the reflection adjustment layer 312 increases. If the transmittance of the reflection adjustment layer 312 is rapidly reduced, an efficiency of extracting light generated from the emission layers 230R, 230G and 230B to outside may degrade. Therefore, in one or more exemplary embodiment of the invention, the reflection adjustment layer 312 is disposed or formed to be relatively small in thickness and to include the phase control layers 311R, 311G and 311B thereunder for which thicknesses thereof are adjusted.

In addition, although some of the external light transmits through the reflection adjustment layer 312 to be reflected by the upper surface of the opposite electrode 250, other of the external light is reflected by the upper surface of the reflection adjustment layer 312 so that the destructive interference may occur between the light reflected by the upper surface of the opposite electrode 250 and the light reflected by the upper surface of the reflection adjustment layer 312. Therefore, the reflection adjustment layer 312 has a metallic property, similarly to the opposite electrode 250. Since a certain layer shows the metallic property when the light extinction coefficient thereof increases, the reflective adjustment layer 312 may have the light extinction coefficient that is greater than those of the phase control layers 311R, 311G and 311B which are under the reflection adjustment layer 312.

As described above, the difference between the optical paths of the light L1 and L2 is adjusted so that there is destructive interference between the light L1 reflected by the upper surface of the opposite electrode 250 and the light L2 reflected by the upper surface of the reflection adjustment layer 312. Thus, the difference between the optical paths may be expressed by a function of the thickness (d1 in FIG. 5) of the phase control layers 311R, 311G and 311B and the thickness (d2 in FIG. 5) of the reflection adjustment layer 312, refractive indexes of the above layers, and an incident angle of the light incident to the reflection adjustment layer 312. Since the refractive index varies depending on a material forming the layer, the difference between the optical paths may be alternatively or more simply expressed by a function of thicknesses of layers and incident angle. In an exemplary embodiment, the organic light-emitting display apparatus may be manufactured by considering a certain incident angle of an environment, in which the organic light-emitting display apparatus will be generally used.

In an exemplary embodiment, for example, where an organic light-emitting display apparatus is used in a portable electronic device, a user generally uses the portable electronic device while grasping the portable electronic device with his/her hands and illumination is generally located above the user. Therefore, considering the illumination located above the user, the thickness of the opposite electrode 250, the reflection adjustment layer 312, and the phase control layers 311R, 311G and 311B within the organic light-emitting display apparatus may be set under an assumption of a light incident angle is about 45°. If an organic light-emitting display apparatus is used in a relative large or non-portably electronic device such as a television, the thickness of the opposite electrode 250, the reflection adjustment layer 312, and the phase control layers 311R, 311G and 311B may be set under an assumption where the incident angle is 0° in order to prevent degradation of image visibility due to light incident perpendicularly to the organic light-emitting display apparatus.

Figure 6:
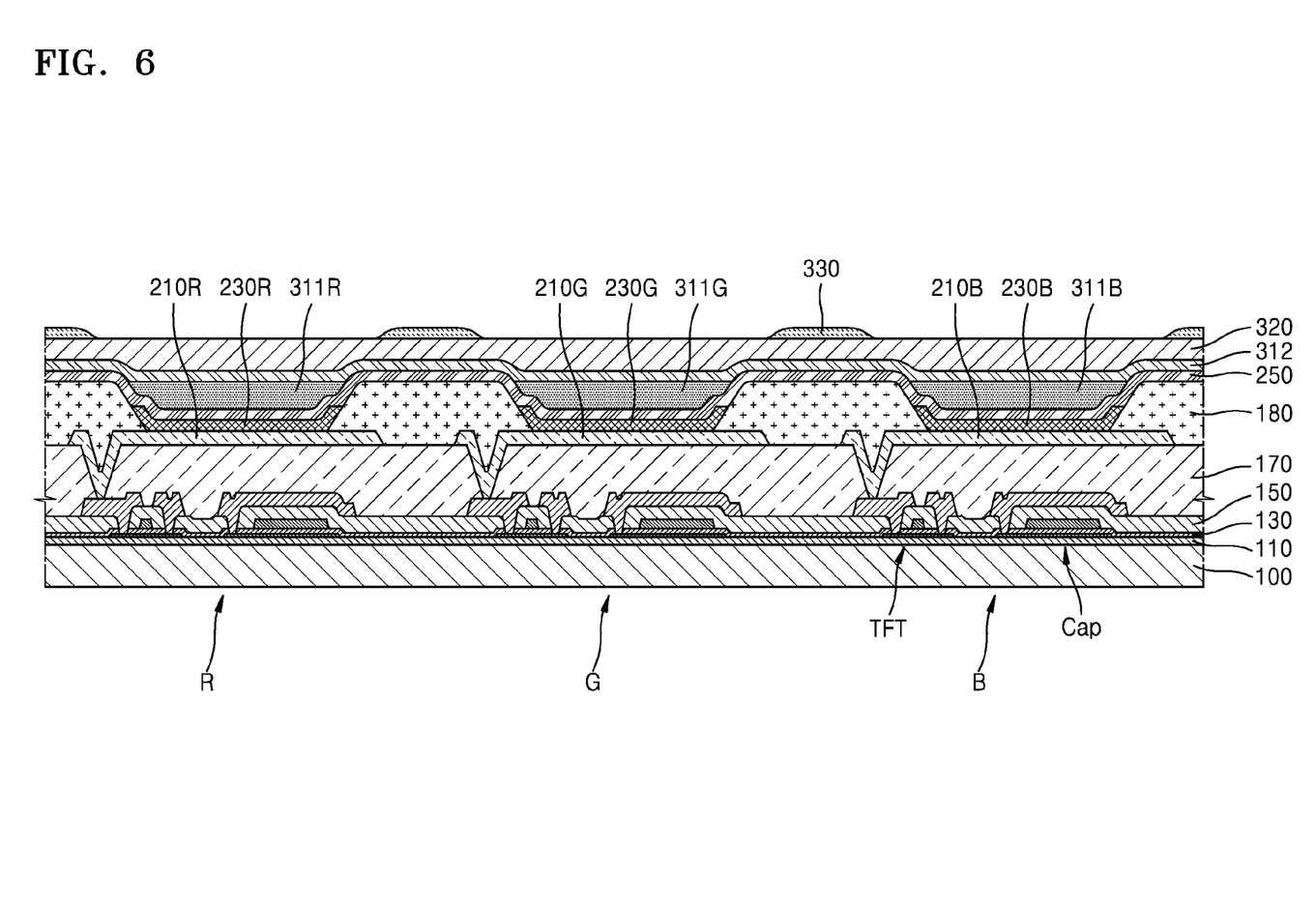
FIG. 6 is a schematic cross-sectional view of another exemplary embodiment of an organic light-emitting display apparatus according to the invention.

FIG. 6 is a schematic cross-sectional view of another exemplary embodiment of an organic light-emitting display apparatus according to the invention. The exemplary embodiment of the organic light-emitting display apparatus according to the invention further includes a thin film encapsulation layer 320 and a light absorbing layer 330. The thin film encapsulation layer 320 and the light absorbing layer 330 are disposed closest to the viewing side of the organic light-emitting display apparatus.

The thin film encapsulation layer 320 covers the reflection adjustment layer 312 to reduce infiltration of external impurities such as oxygen or moisture into the organic light-emitting display apparatus. The thin film encapsulation layer 320 may disposed commonly to the pixels (or sub-pixels) of the organic light-emitting display apparatus. The thin film encapsulation layer 320 may include an inorganic layer and an organic layer, and may have a multi-layered structure in which the inorganic layer and the organic layer are alternately stacked.

The light absorbing layer 330 is patterned to define portions thereof spaced apart from each other and corresponding to the plurality of pixel electrodes 210R, 210G and 210B, and is located over the thin film encapsulation layer 320. In an exemplary embodiment, for example, the light absorbing layer 330 may have a similar shape or arrangement in the top plan view to that of the pixel defining layer 180 as shown in FIG. 2. That is, the light absorbing layer 330 may have a shape corresponding to that of the pixel defining layer 180, in the top plan view.

As described above with reference to FIG. 5, image visibility may be improved by reducing external light reflection by using the phase control layers 311R, 311G and 311B and the reflection adjustment layer 312. However, since the phase control layers 311R, 311G and 311B do not exist over spaces between the pixel electrodes 210R, 210G and 210B, the reflection of external light may not be reduced efficiently at such spaces. According to the exemplary embodiment of the organic light-emitting display apparatus in FIG. 6, the light absorbing layer 330 that is patterned to correspond to the spaces defined between the plurality of pixel electrodes 210R, 210G and 210B is provided, and thus, the reflection of external light at the spaces between the pixel electrodes 210R, 210G and 210B may be reduced by using the light absorbing layer 330. As such, one or more exemplary embodiment of the organic light-emitting display apparatus according to the invention may greatly improve image visibility. The light absorbing layer 330 may include, for example, a material for forming black matrix.

Figure 7:
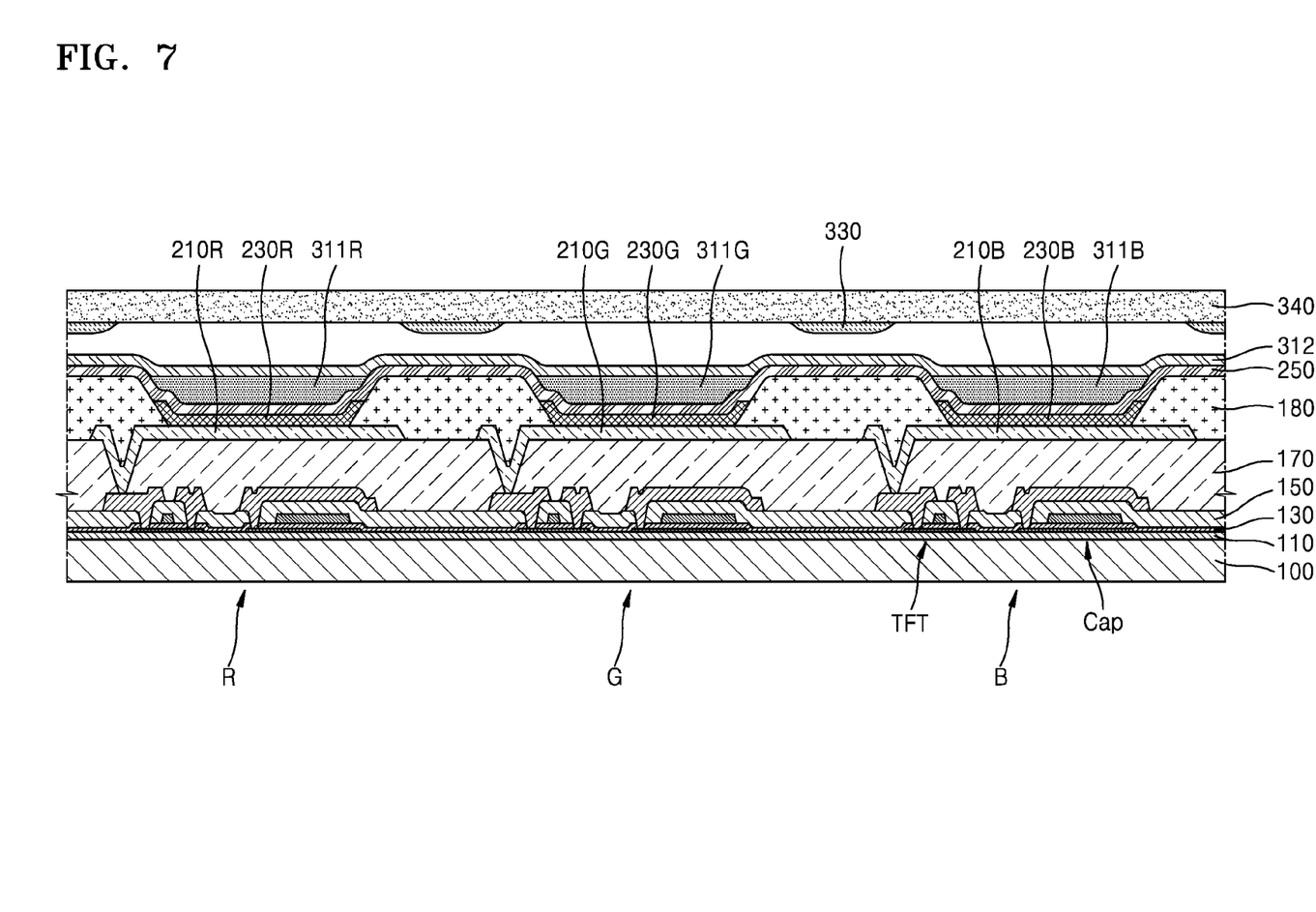
FIG. 7 is a schematic cross-sectional view of still another exemplary embodiment of an organic light-emitting display apparatus according to the invention.

FIG. 7 is a schematic cross-sectional view of still another exemplary embodiment of an organic light-emitting display apparatus according to the invention. The exemplary embodiment of the organic light-emitting display apparatus according to the invention may further include an encapsulation substrate 340 and the light absorbing layer 330. The encapsulation substrate 340 is located above the reflection adjustment layer 312, and is coupled to the substrate 100 by a sealing member (not shown) such as a sealant. The sealing member is disposed outside of the structure illustrated in FIG. 7 such that the encapsulation substrate 340 in FIG. 7 is disposed spaced apart from the reflection adjustment layer 312. The light absorbing layer 330 is patterned to define portions thereof spaced apart from each other and corresponding to the plurality of pixel electrodes 210R, 210G and 210B, and is located at a surface of the encapsulation substrate 340 (e.g., a lower surface thereof) which faces the reflection adjustment layer 312. The encapsulation substrate 340 is disposed closest to the viewing side of the organic light-emitting display apparatus.

As described above with reference to FIG. 5, image visibility may be improved by reducing the external light reflection via the phase control layers 311R, 311G and 311B and the reflection adjustment layer 312. However, since the phase control layers 311R, 311G and 311B do not exist over the spaces between the pixel electrodes 210R, 210G and 210B, the external light reflection may not be reduced effectively at such spaces. According to the exemplary embodiment of the organic light-emitting display apparatus in FIG. 7, the light absorbing layer 330 that is patterned to correspond to the spaces defined between the plurality of pixel electrodes 210R, 210G and 210B is provided, and thus, the reflection of external light at the spaces between the pixel electrodes 210R, 210G and 210B may be also reduced by using the light absorbing layer 330. As such, one or more exemplary embodiment of the organic light-emitting display apparatus according to the invention may greatly improve the image visibility.

According to the one or more exemplary embodiments, the organic light-emitting display apparatus capable of displaying relatively high quality images may be implemented.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a plurality of pixel electrodes spaced apart from one another;
   a pixel defining layer overlapping edges of each of the plurality of pixel electrodes;
   an opposite electrode disposed commonly overlapping the plurality of pixel electrodes and the pixel defining layer;
   an emission layer provided in plural between the plurality of pixel electrodes and the opposite electrode, the plural emission layers respectively overlapping the plurality of pixel electrodes;
   a reflection adjustment layer disposed overlapping the plurality of pixel electrodes and the pixel defining layer, the reflection adjustment layer having conductivity and contacting the opposite electrode; and
   a phase control layer provided in plural spaced apart from each other between the opposite electrode and the reflection adjustment layer.

2. The organic light-emitting display apparatus of claim 1, wherein the reflection adjustment layer defines a light extinction coefficient greater than a light extinction coefficient defined by the phase control layer.

3. The organic light-emitting display apparatus of claim 2, wherein
   the phase control layer is disposed directly between the opposite electrode and the reflection adjustment layer,
   at each of the plural emission layers, a maximum thickness of the phase control layer defines a first thickness and a maximum thickness of the reflection adjustment layer defines a second thickness,
   among light incident to the reflection adjustment layer at each of the plural emission layers, a first light is reflected by an upper surface of the reflection adjustment layer and a second light is transmitted through the reflection adjustment layer and the phase control layer to be reflected by an upper surface of the opposite electrode, and
   a sum of the first thickness and the second thickness causes destructive interference of the first and second lights.

4. The organic light-emitting display apparatus of claim 2, wherein
   the phase control layer is disposed directly between the opposite electrode and the reflection adjustment layer,
   at each of the plural emission layers, an upper surface of the opposite electrode and an upper surface of the reflection adjustment layer are spaced apart from each other by a distance,
   among light incident to the reflection adjustment layer at each of the plural emission layers, a first light is reflected by an upper surface of the reflection adjustment layer and a second light is transmitted through the reflection adjustment layer and the phase control layer to be reflected by an upper surface of the opposite electrode, and
   a maximum of the distance between the upper surface of the opposite electrode and the upper surface of the reflection adjustment layer at each of the plural emission layers causes destructive interference of the first and second lights.

5. The organic light-emitting display apparatus of claim 2, wherein the reflection adjustment layer comprises Ti, Mo, Mn, Cr, W, Ti, Ni, Co, Cu, $CrN_x$, $TiN_x$, $TiAlN_x$, NiS or TiC.

6. The organic light-emitting display apparatus of claim 2, wherein the phase control layer comprise $SiN_x$, $SiO_2$, SiCN, LiF, $MgF_2$, $CaF_2$, SiON, $Ta_xO_y$, or $TiO_x$.

7. The organic light-emitting display apparatus of claim 1, wherein
the phase control layer includes parts spaced apart from each other and exposing portions of the opposite electrode, and
the reflection adjustment layer having conductivity contacts the exposed portions of the opposite electrode between the parts of the phase control layer spaced apart from each other.

8. The organic light-emitting display apparatus of claim 1, wherein the phase control layer includes parts spaced apart from each other respectively and corresponding to the plurality of pixel electrodes.

9. The organic light-emitting display apparatus of claim 1, further comprising a display area in which the plurality of pixel electrodes is located,
wherein the reflection adjustment layer is provided as a single body to commonly overlap the plurality of pixel electrodes in the display area.

10. The organic light-emitting display apparatus of claim 9, wherein the reflection adjustment layer which commonly overlaps the plurality of pixel electrodes in the display area corresponds to the opposite electrode which commonly overlaps the plurality of pixel electrodes and the pixel defining layer.

11. The organic light-emitting display apparatus of claim 1, wherein the plurality of pixel electrodes spaced apart from one another define spaces therebetween,
further comprising:
a thin film encapsulation layer commonly overlapping the plurality of pixel electrodes and the pixel defining layer to cover the reflection adjustment layer; and
a light absorbing layer over the thin film encapsulation layer, the light absorbing layer defining portions thereof spaced apart from each other to correspond to the plurality of pixel electrodes.

12. The organic light-emitting display apparatus of claim 1, wherein the plurality of pixel electrodes spaced apart from one another define spaces therebetween,
further comprising:
an encapsulation substrate commonly overlapping the plurality of pixel electrodes and the pixel defining layer to cover the reflection adjustment layer; and
a light absorbing layer on the encapsulation substrate, the light absorbing layer defining portions thereof spaced apart from each other to correspond to the plurality of pixel electrodes,
wherein the light absorbing layer is disposed between the encapsulation substrate and the reflection adjustment layer.

* * * * *